United States Patent
Baik et al.

(10) Patent No.: US 8,590,108 B2
(45) Date of Patent: Nov. 26, 2013

(54) COMPUTER CHASSIS HANDLE

(75) Inventors: David Baik, Sunnyvale, CA (US); David Willheim, Sunnyvale, CA (US); Anwyl McDonald, Sunnyvale, CA (US)

(73) Assignee: NetApp, Inc., Sunnyvale, CA (US)

( * ) Notice: Subject to any disclaimer, the term of this patent is extended or adjusted under 35 U.S.C. 154(b) by 385 days.

(21) Appl. No.: 12/399,358

(22) Filed: Mar. 6, 2009

(65) Prior Publication Data

US 2010/0223759 A1 Sep. 9, 2010

(51) Int. Cl.
A45C 13/26 (2006.01)
(52) U.S. Cl.
USPC .............................. 16/419; 16/420
(58) Field of Classification Search
USPC ........ 16/415, 416, 419, 420, 110.1, 436, 438, 16/440, 443, 444, 445, 446, DIG. 15, 405, 16/408; 312/348.6, 332.1, 244
See application file for complete search history.

(56) References Cited

U.S. PATENT DOCUMENTS

| 1,374,126 | A | * | 4/1921 | Walter | 16/408 |
| 2,323,094 | A | * | 6/1943 | Levin | 16/405 |
| 2,364,073 | A | * | 12/1944 | Howard | 16/440 |
| 2,636,641 | A | * | 4/1953 | Wiepert | 16/405 |
| 3,115,229 | A | * | 12/1963 | Erhard | 16/408 |
| 5,845,978 | A | * | 12/1998 | Jung | 312/244 |
| 6,389,645 | B1 | * | 5/2002 | Polidoro | 16/405 |
| 6,446,988 | B1 | * | 9/2002 | Kho | 16/405 |
| 7,325,846 | B2 | * | 2/2008 | Smith et al. | 312/223.3 |
| 7,516,520 | B2 | * | 4/2009 | Kelaher et al. | 16/445 |

* cited by examiner

*Primary Examiner* — Jeffrey O Brien
(74) *Attorney, Agent, or Firm* — Klein, O'Neill & Singh, LLP

(57) ABSTRACT

A computer chassis handle may comprise: (a) at least one handle portion rotatable about a first axis of rotation; and (b) at least one support portion rotatable about a second axis of rotation.

A computer chassis may comprise: (a) a computer chassis body; and (b) at least one rotatable handle.

15 Claims, 4 Drawing Sheets

COMPUTER CHASSIS HANDLE

SUMMARY OF THE INVENTION

The present invention is directed to a computer chassis handle.

A computer chassis handle may comprise: (a) at least one handle portion rotatable about a first axis of rotation; and (b) at least one support portion rotatable about a second axis of rotation.

A computer chassis may comprise: (a) a computer chassis body; and (b) at least one rotatable handle.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The Detailed Description below may be better understood by those skilled in the art by reference to the accompanying figures in which.

DETAILED DESCRIPTION

Figure 1:
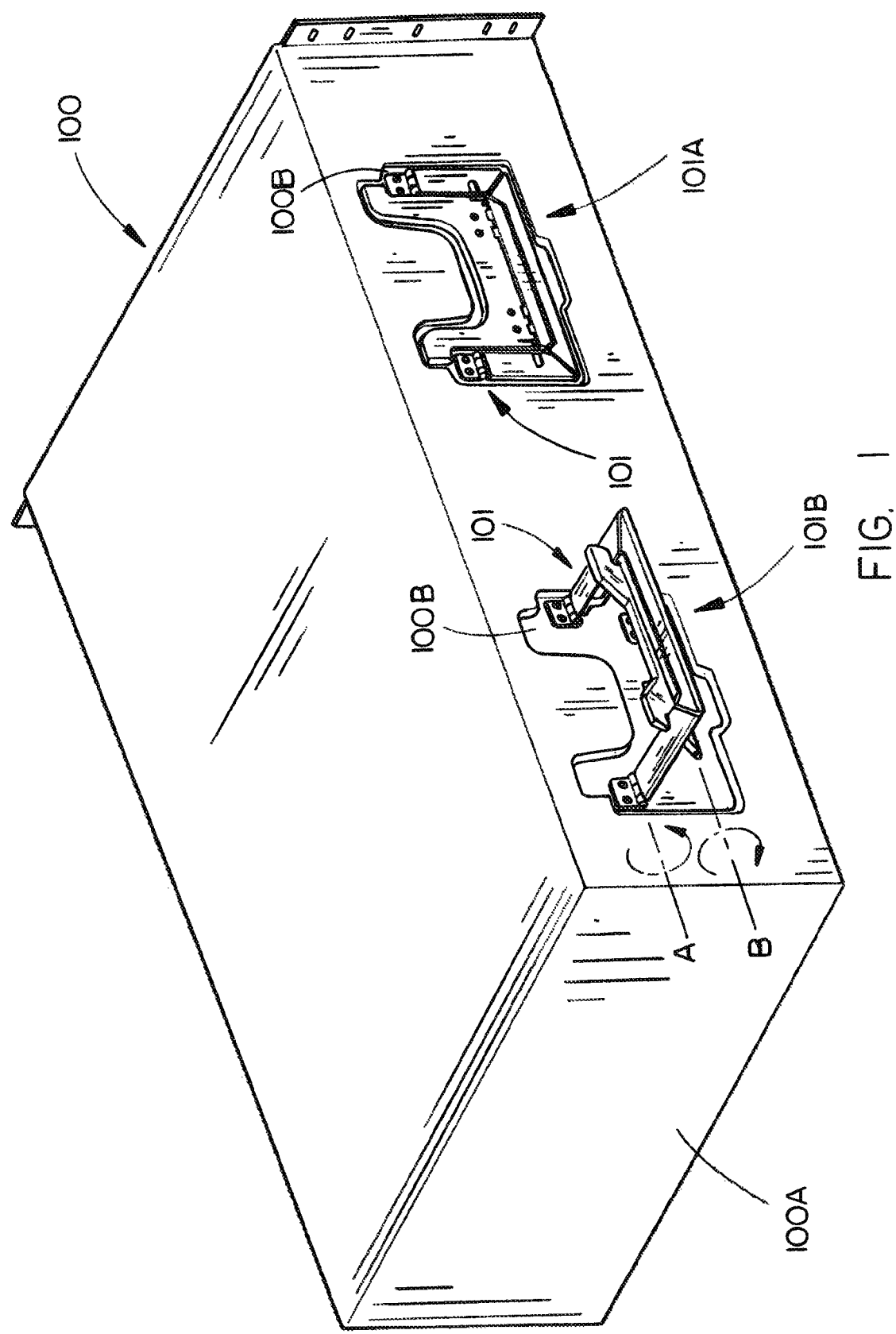
FIG. 1 depicts a perspective view of a computer chassis handle.

It is to be understood that both the foregoing general descriptions and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Referring to FIG. 1, a computer chassis 100 including a computer chassis body 100A and at least one rotatable handle 101 is shown. The rotatable handle 101 may include a handle portion 102 and a support portion 103. The rotatable handle 101 may be in a retracted position (e.g. rotatable handle 101A) or an extended position (e.g. rotatable handle 101B). Upon application of a rotational force to the handle portion 102 of the rotatable handle 101, the rotatable handle 101 may be moved from the retracted position to the extended position.

Figure 2:
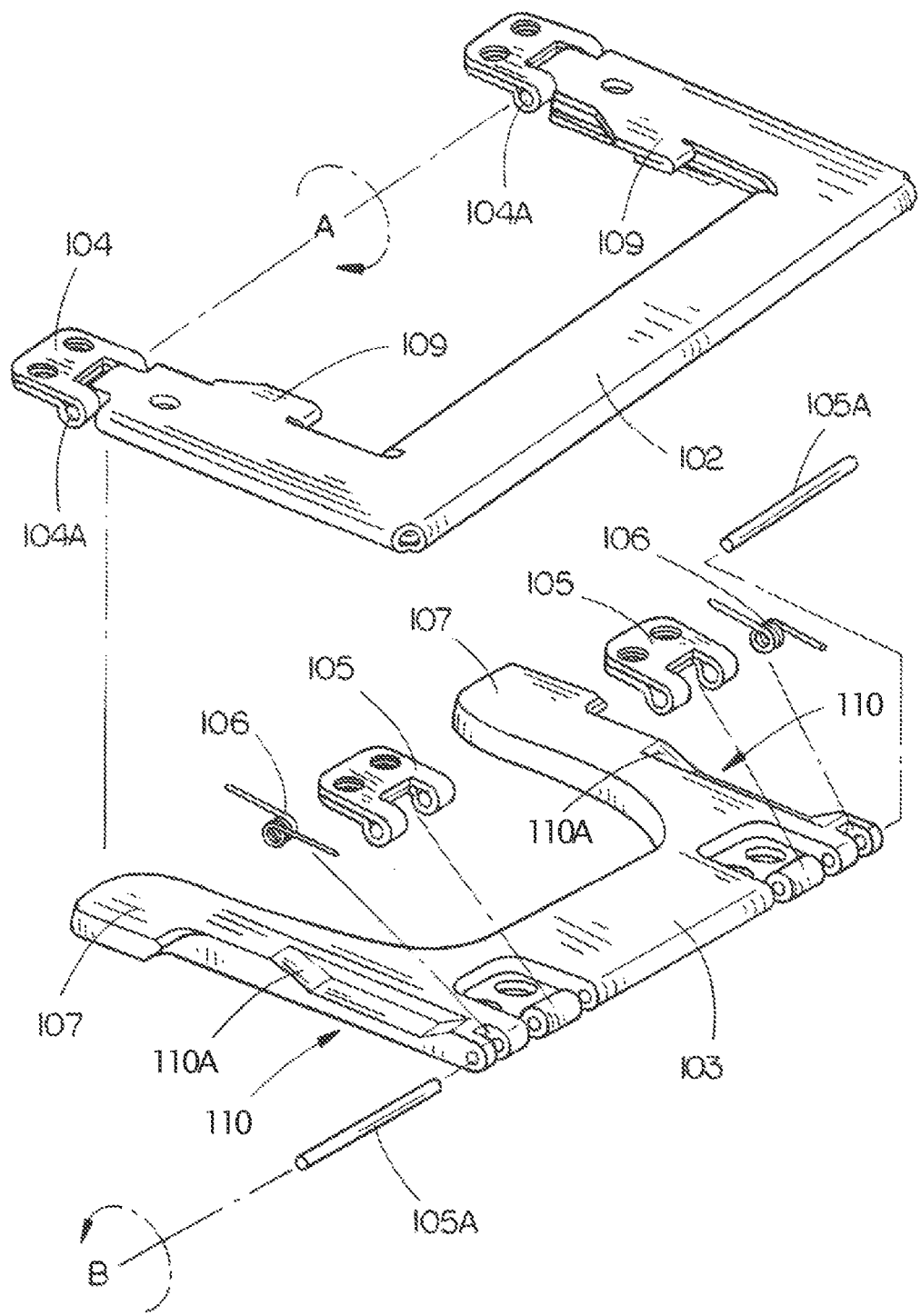
FIG. 2 depicts an exploded view of a computer chassis handle.
Figure 3:
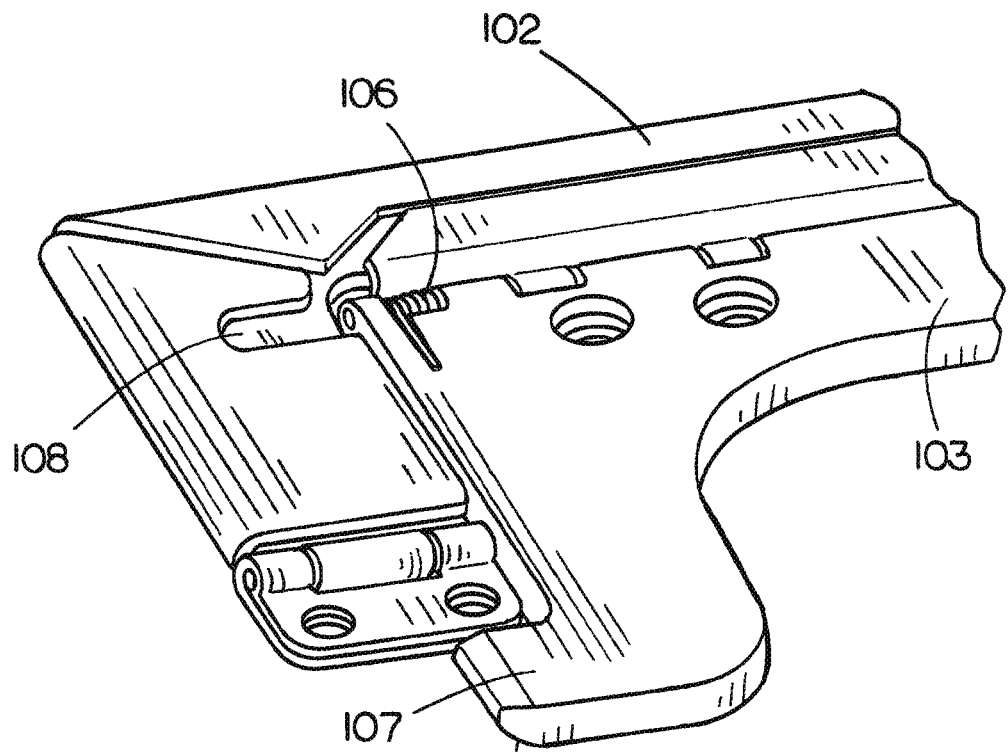
FIG. 3 depicts a front perspective view of a computer chassis handle.
Figure 4:
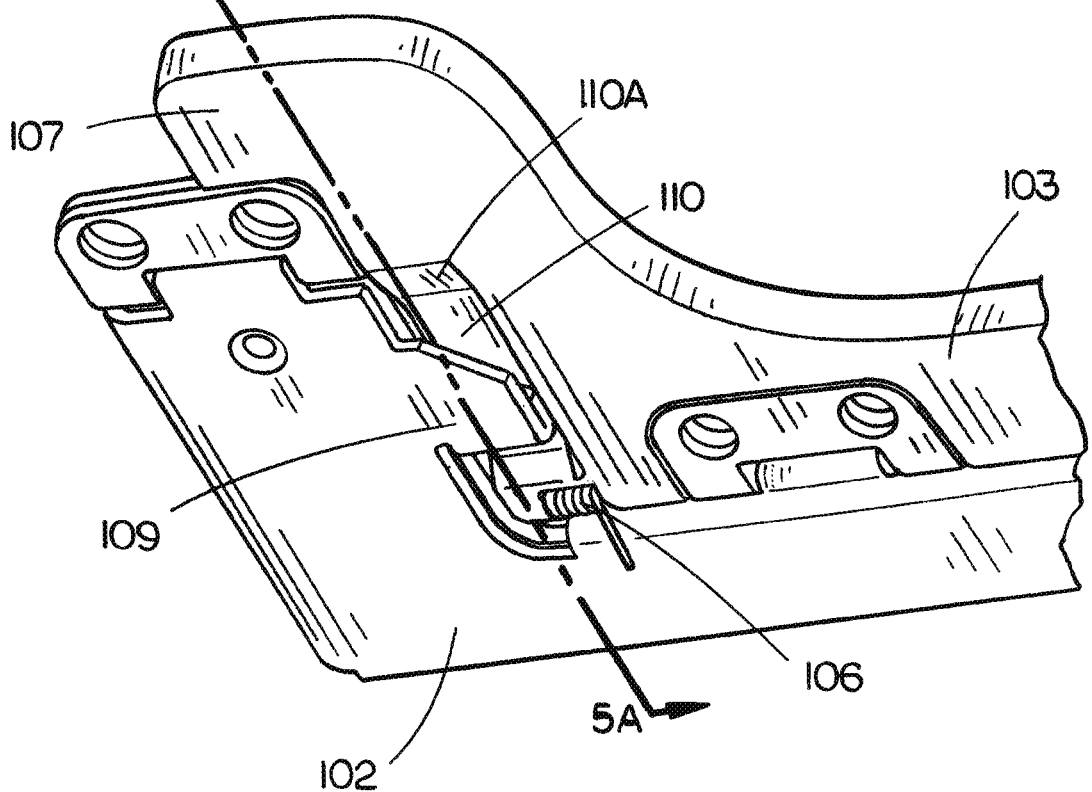
FIG. 4 depicts a rear perspective view of a computer chassis handle.

Referring to FIGS. 2-4, the handle portion 102 may be operably coupled to the computer chassis body 100A by a handle hinge 104 having an axis of rotation A. The support portion 103 may be operably coupled to the computer chassis body 100A by a support hinge 105 having an axis of rotation B.

The support portion 103 may include at least one spring 106 (e.g. a torsion spring) configured to retain the rotatable handle 101 in a retracted position relative to the computer chassis body 100A in the absence of a lifting force applied to the handle portion 102 by a user or locking of the rotatable handle 101 in an extended position, as will be discussed below. The at least one spring 106 and the at least one support hinge 105 may be operably coupled to the support portion 103 by at least one dowel pin 105A. Similarly, the at least one handle hinge 104 may be operably coupled to the handle portion 102 by at least one dowel pin 104A.

The support portion 103 may further include a locking tab 107. The handle portion 102 may include a corresponding locking recess 108.

Figure 5B:
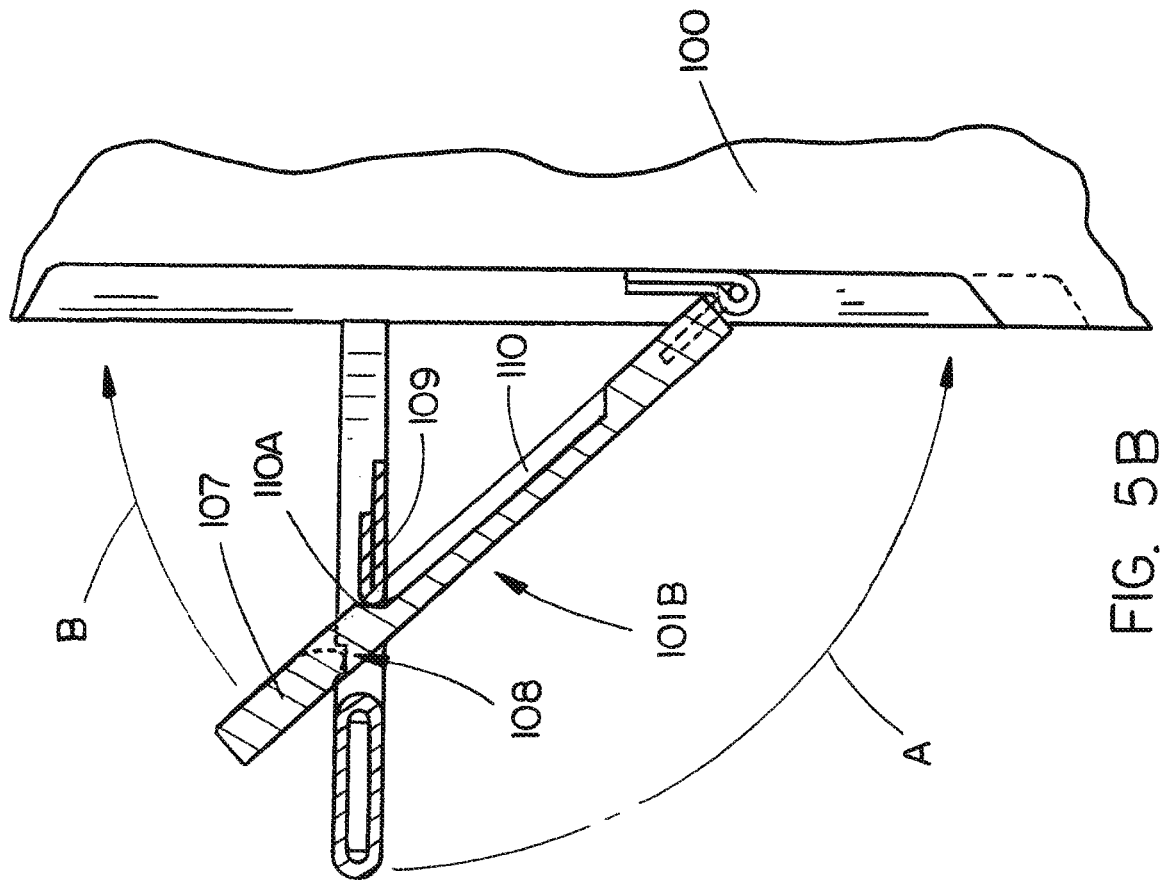
FIG. 5B depicts a cross-sectional view of a computer chassis handle.
Figure 5A:
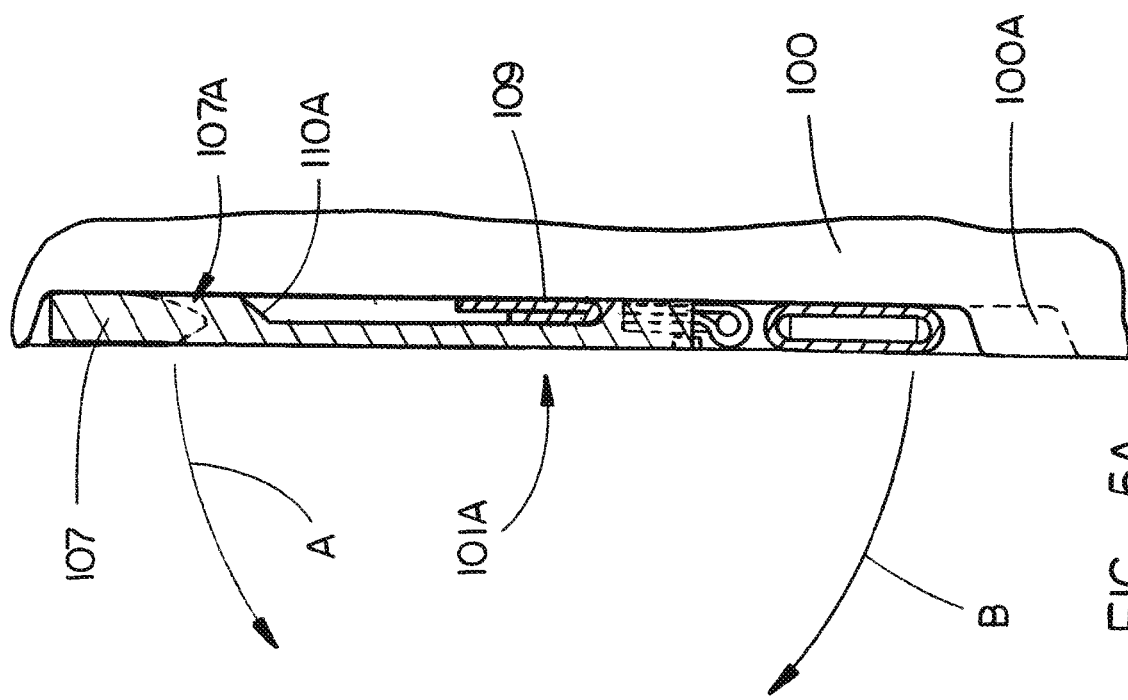
FIG. 5A depicts a cross-sectional view of a computer chassis handle.

Referring to FIGS. 5A and 5B, upon rotation of the rotatable handle 101 from a retracted position (e.g. as depicted in FIG. 5A) into an extended position (e.g. as depicted in FIG. 5B), the locking tab 107 may be disposed within the locking recess 108 so as to frictionally engage the locking recess 108 in order to secure the rotatable handle 101 in the extended position. Such a configuration may place the support portion 103 at least partially under tension during lifting of the computer chassis 100 so as to enhance the durability of the rotatable handle 101.

The locking tab 107 may include one or more arcuate surfaces 107A to facilitate the displacement of the locking tab 107 from the locking recess 108 upon retraction of the rotatable handle 101 from the extended position.

Referring again to FIGS. 2-4, the handle portion 102 may include at least one actuating tab 109. The support portion 103 may include at least one actuating tab receiving recess 110 corresponding to the at least one actuating tab 109. The actuating tab receiving recess 110 may include an inclined actuating tab deflection portion 110A.

Referring again to FIGS. 5A and 5B, the actuating tab deflection portion 110A may deflect the actuating tab 109 when the handle portion 102 is rotated about axis of rotation A so as to rotate the support portion 103 about axis of rotation B thereby moving the rotatable handle 101 into an extended position. Deflection of the actuating tab 109 by the actuating tab deflection portion 110A of the actuating tab receiving recess 110 may operate to set the locking tab 107 within the locking recess 108 while further frictionally coupling the actuating tab 109 and the actuating tab receiving recess 110 thereby securing the rotatable handle 101 in an extended position.

Further, the combined depth of the actuating tab 109 and the portion of the support portion 103 defining the actuating tab receiving recess 110 may be less than or equal of the overall depth of the rotatable handle 101 allowing for the rotatable handle 101 to be retracted into a flush configuration with respect to the computer chassis body 100A.

Referring again to FIGS. 1 and 5A, the computer chassis body 100A may include at least one handle receiving recess 100B. The handle receiving recess 100B may have a depth such that the rotatable handle 101 may be received fully within the handle receiving recess 100B when in a retracted position (e.g. rotatable handle 101A).

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A handle comprising:
   at least one handle portion rotatable about a first axis of rotation, the at least one handle portion having at least one locking recess; and
   at least one support portion rotatable about a second axis of rotation substantially parallel to the first axis of rotation, the at least one support portion having at least one locking tab;
   wherein rotation of the at least one handle portion about the first axis of rotation results in substantially opposite rotation of the at least one support portion about the second axis of rotation;
   wherein the at least one handle portion and the at least one support portion are rotatable between a retracted position and an extended position, and when in the retracted position the at least one handle portion and the at least one support portion are coplanar; and
   wherein the at least one locking tab engages the at least one locking recess only when the at least one handle portion and the at least one support portion are in the extended position.

2. The handle of claim 1, wherein the at least one locking tab is received within the at least one locking recess upon rotation of the at least one handle portion about the first axis of rotation and rotation of the at least one support portion about the second axis of rotation to configure the at least one handle portion in a substantially static position relative to the at least one support portion.

3. The handle of claim 1, wherein the at least one locking tab further comprises:
   at least one arcuate surface.

4. The handle of claim 1, wherein the at least one handle portion further comprises:
   at least one actuating tab.

5. The handle of claim 4, wherein the support portion further comprises:
   at least one actuating tab receiving recess.

6. The handle of claim 5, wherein the at least one actuating tab exerts a force on the at least one actuating tab receiving recess upon rotation of the handle portion about the first axis of rotation.

7. The handle of claim 5, wherein the actuating tab receiving recess further comprises:
   at least one actuating tab deflection portion.

8. The handle of claim 1,
   wherein the first axis of rotation is defined by a rotational coupling between the handle portion and a base surface; and
   wherein the second axis of rotation is defined by a rotational coupling between the support portion and the base surface.

9. A computer chassis comprising:
   a computer chassis body; and
   at least one rotatable handle, wherein the at least one rotatable handle comprises:
      at least one handle portion rotatable about a first axis of rotation, the at least one handle portion having at least one locking recess; and
      at least one support portion rotatable about a second axis of rotation substantially parallel to the first axis of rotation, the at least one support portion having at least one locking tab;
   wherein rotation of the at least one handle portion about the first axis of rotation results in substantially opposite rotation of the at least one support portion about the second axis of rotation;
   wherein the at least one handle portion and the at least one support portion are rotatable between a retracted position and an extended position; and
   wherein the at least one locking tab engages the at least one locking recess only when the at least one handle portion and the at least one support portion are in the extended position.

10. The computer chassis of claim 9, wherein the at least one locking tab is received within the at least one locking recess upon rotation of the at least one handle portion about the first axis of rotation and rotation of the at least one support portion about the second axis of rotation to configure the at least one handle portion in a substantially static position relative to the at least one support portion.

11. The computer chassis of claim 9, wherein the at least one locking tab further comprises:
    at least one arcuate surface.

12. The computer chassis of claim 9, wherein the at least one handle portion further comprises:
    at least one actuating tab.

13. The computer chassis of claim 12, wherein the support portion further comprises:
    at least one actuating tab receiving recess.

14. The computer chassis of claim 13, wherein the at least one actuating tab exerts a force on the at least one actuating tab receiving recess upon rotation of the handle portion about the first axis of rotation.

15. The computer chassis of claim 13, wherein the actuating tab receiving recess further comprises:
    at least one actuating tab deflection portion.

* * * * *